(12) United States Patent
Yoshioka

(10) Patent No.: US 6,168,667 B1
(45) Date of Patent: Jan. 2, 2001

(54) RESIST-PROCESSING APPARATUS

(75) Inventor: Kazutoshi Yoshioka, Kumamoto-ken (JP)

(73) Assignee: Tokyo Electron Limited, Tokyo (JP)

( * ) Notice: Under 35 U.S.C. 154(b), the term of this patent shall be extended for 0 days.

(21) Appl. No.: 09/085,758

(22) Filed: May 27, 1998

(30) Foreign Application Priority Data

| May 30, 1997 | (JP) | 9-142735 |
| May 30, 1997 | (JP) | 9-142736 |
| May 30, 1997 | (JP) | 9-142737 |
| May 30, 1997 | (JP) | 9-142738 |

(51) Int. Cl.$^7$ .............................. C23C 16/00; B65G 49/07
(52) U.S. Cl. .................... 118/715; 118/719; 118/720; 118/724; 414/935; 414/937; 414/940; 414/941
(58) Field of Search .................... 118/715, 719, 118/720, 724, 733; 414/935, 937, 940, 941

(56) References Cited

U.S. PATENT DOCUMENTS

| 4,985,722 | * | 1/1991 | Ushijima et al. | 354/319 |
| 5,177,514 | * | 1/1993 | Ushijima et al. | 354/319 |
| 5,202,716 | * | 4/1993 | Tateyama et al. | 354/319 |
| 5,297,910 | * | 3/1994 | Yoshioka et al. | 414/225 |
| 5,339,128 | * | 8/1994 | Tateyama et al. | 354/317 |
| 5,442,416 | * | 8/1995 | Tateyama et al. | 354/319 |
| 5,766,360 | * | 6/1998 | Sato | 118/719 |
| 5,932,014 | * | 8/1999 | Hayashi | 118/719 |

FOREIGN PATENT DOCUMENTS

| 1-209737 | * | 8/1989 | (JP) . |
| 07171478 | * | 7/1995 | (JP) . |

* cited by examiner

Primary Examiner—Nasser Ahmad
(74) Attorney, Agent, or Firm—Oblon, Spivak, McClelland, Maier & Neustadt, P.C.

(57) ABSTRACT

A resist-processing apparatus comprising a plurality of first processing units, a second processing unit, a first transport unit, a second transport unit, and an interface section. The first processing units are designed to process a wafer, and the second processing unit to process the wafer. The first transport unit has a first arm mechanism for loading and unloading the wafer into and from each of the first processing units. The second transport unit opposes the first transport unit, with the first processing units located between the first transport unit and the second transport unit. The second transport unit has a second arm mechanism for loading and unloading the wafer into and from at least one of the first processing units and into and from the second processing unit. The interface section is to be provided adjacent to an exposure apparatus. The first arm mechanism transfers the wafer between the first transport unit and the exposure apparatus.

26 Claims, 8 Drawing Sheets

RESIST-PROCESSING APPARATUS

BACKGROUND OF THE INVENTION

The present invention relates to a resist-processing apparatus for performing a sequence of resist-processing steps on an object such as a semiconductor wafer or an LCD glass substrate.

In the manufacture of semiconductor devices, photolithography is effected to form circuit patterns. Photolithography comprises the steps of coating a resist on the surface of a substrate, baking the resist coated, exposes the resist to light, and developing the resist exposed to light. Such a sequence of processing a resist can be performed by, for example, the resist-processing apparatus (or system for coating and developing a resist) and the exposure apparatus, both disclosed in Jpn. Pat. Appln. KOKAI Publication No. 2-30194.

Recently, substrates are transported between such a resist-processing apparatus and such an exposure apparatus through an airtight interface section. The substrates are so transported so that they may not be affected by the atmosphere. The airtight interface section serves to prevent the substrates from being exposed to the clean-room atmosphere as the substrates are moved from the resist-processing apparatus to the exposure apparatus, and vice versa.

Air cleaned is introduced into the resist-processing apparatus and the exposure apparatus, in down-flow fashion, to prevent contaminators, such as particles and dust, form entering the apparatuses and to expel contaminators from the apparatuses. Since air thus is introduced into the apparatuses, the inner pressures of the apparatuses remain higher than the atmospheric pressure.

Usually, the exposure apparatus has a higher inner pressure than the resist-processing apparatus. Contaminators such as particles are therefore likely to move from the exposure apparatus into the resist-processing apparatus through the interface section. Consequently, the contaminators may stick onto the substrates located in the resist-processing apparatus. If contaminators stick to the substrates before, during or after the resist-coating step, or before, during or after the resist-developing step, the circuit patterns formed on the surface of each substrate will more likely have defects than otherwise.

As mentioned above, contaminators are likely to move into the conventional resist-processing apparatus from the exposure apparatus through the interface section. The use of the conventional resist-processing apparatus may lower the yield of manufacturing semiconductor devices.

In the conventional resist-processing apparatus, the cassette station, the arm mechanism for transporting substrates, and the like generate particles and dust. The particles and dust generated in the resist-processing apparatus may stick onto the substrates.

In the resist-processing apparatus, the resist is coated and developed while the temperature of the substrates is controlled with high precision. This is because the temperature of each substrate is one of the factors that greatly influence the thickness of the resist and the width of lines formed by using the resist as a mask. The temperature of each substrate is controlled more and more accurately in order to form finer circuit patterns on the substrate.

It is, therefore, increasingly demanded that the processing units using liquids, such as the resist-coating unit and the developing unit, be protected from the heat generated by the heat treatment unit (mainly, the baking unit).

BRIEF SUMMARY OF THE INVENTION

In view of the foregoing, an object of the present invention is to provide a resist-processing apparatus in which entry of a unit, such as an exposure unit, into a unit using liquid can be effectively suppressed, thereby to increase the yield of the manufacture of semiconductor devices.

Another object of the invention is to provide a resist-processing apparatus in which a unit using liquid is hardly affected by the heat generated in a unit of any other type.

According to a first aspect of the invention, there is provided a resist-processing apparatus comprising:

a plurality of first processing units for processing a substrate;

a second processing unit for processing the substrate;

a first transport unit having a first arm mechanism for loading and unloading the substrate into and from each of the first processing units;

a second transport unit opposing the first transport unit, with the first processing units located between the first transport unit and the second transport unit, and having a second arm mechanism for loading and unloading the substrate into and from at least one of the first processing units and into and from the second processing unit; and an interface section to be provided adjacent to an external apparatus which is designed to process the substrate which has been processed in at least one of the first and second processing units, for transferring the substrate between the first transport unit and the external apparatus by using the first arm mechanism.

According to a second aspect of the invention, there is provided a resist-processing apparatus comprising:

a plurality of first processing units for processing a substrate;

a second processing units for processing the substrate;

a first transport unit having a first arm mechanism for loading and unloading the substrate into and from each of the first processing units;

a second transport unit opposing the first transport unit, with the first processing units located between the first transport unit and the second transport unit, and having a second arm mechanism for loading and unloading the substrate into and from at least one of the first processing units and into and from the second processing unit; and pressure-adjusting means for rendering an inner pressure of the second transport unit higher than an inner pressure of the first transport unit.

According to a third aspect of this invention, there is provided a resist-processing apparatus comprising:

a plurality of first processing units for processing a substrate;

a second processing unit for processing the substrate;

a first transport unit having a first arm mechanism for loading and unloading the substrate into and from each of the first processing units;

a transfer section for receiving and supplying the substrate from and to an external apparatus; and a second transport unit made airtight with respect to the transfer section, opposing the first transport unit, with the first processing units located between the first transport unit and the second transport unit, and having a second arm mechanism for loading and unloading the substrate into and from at least one of the first processing units and into and from the second processing unit.

According to a fourth aspect of the present invention, there is provided a resist-processing apparatus comprising:

a plurality of first processing units for processing a substrate;

a second processing unit for processing the substrate;

a first transport unit having a first arm mechanism for loading and unloading the substrate into and from each of the first processing units;

a transfer section for receiving and supplying the wafer from and to an external apparatus; and a second transport unit made airtight with respect to the transfer section, opposing the first transport unit, with the first processing units located between the first transport unit and the second transport unit, and having a second arm mechanism for loading and unloading the substrate into and from at least one of the first processing units and into and from the second processing unit.

According to a fifth aspect of the present invention, there is provided a resist-processing apparatus comprising:

a plurality of first processing units for processing a substrate;

a second processing unit for processing the substrate;

a first transport unit having a first arm mechanism for loading and unloading the substrate into and from each of the first processing units;

a second transport unit opposing the first transport unit, with the first processing units located between the first transport unit and the second transport unit, and having a second arm mechanism for loading and unloading the substrate into and from at least one of the first processing units and into and from the second processing unit; and a transfer section having a third arm mechanism for receiving and supplying the substrate from and to an external apparatus, and for receiving and supplying the substrate from and to the first arm mechanism.

According to a sixth aspect of the invention, there is provided a resist-processing apparatus comprising:

a cassette station for inserting and drawing a substrate into and from a cassette;

an interface section for receiving and supplying the substrate to be exposed to light;

a plurality of first processing units for processing a substrate;

a second processing unit for processing the substrate;

a first transport unit having a first arm mechanism for loading and unloading the substrate into and from each of the first processing units; and a second transport unit made airtight with respect to the transfer section, opposing the first transport unit, with the first processing units located between the first transport unit and the second transport unit, and having a second arm mechanism for loading and unloading the substrate into and from at least one of the first processing units and into and from the second processing unit.

In any resist-processing apparatus according to the invention, particles, if any, that have entered the first transport unit via the cassette station or interface section, will scarcely enter the second transport unit incorporating the liquid-using processing units (i.e., the resist-coating unit and the developing unit).

Chemical HEPA filters (ULPA filters) are used in the second transport unit (including the liquid-using processing units, i.e., the resist-coating unit and developing unit), whereas HEPA filters are used in any other region. The chemical HEPA filters can efficiently adsorb and remove chemicals from air. Since each processing unit incorporates a filter optimal to the unit in terms of performance, the system can be made small at lower cost than otherwise.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Various embodiments of the present invention will be described, with reference to the accompanying drawings.

Figure 1:
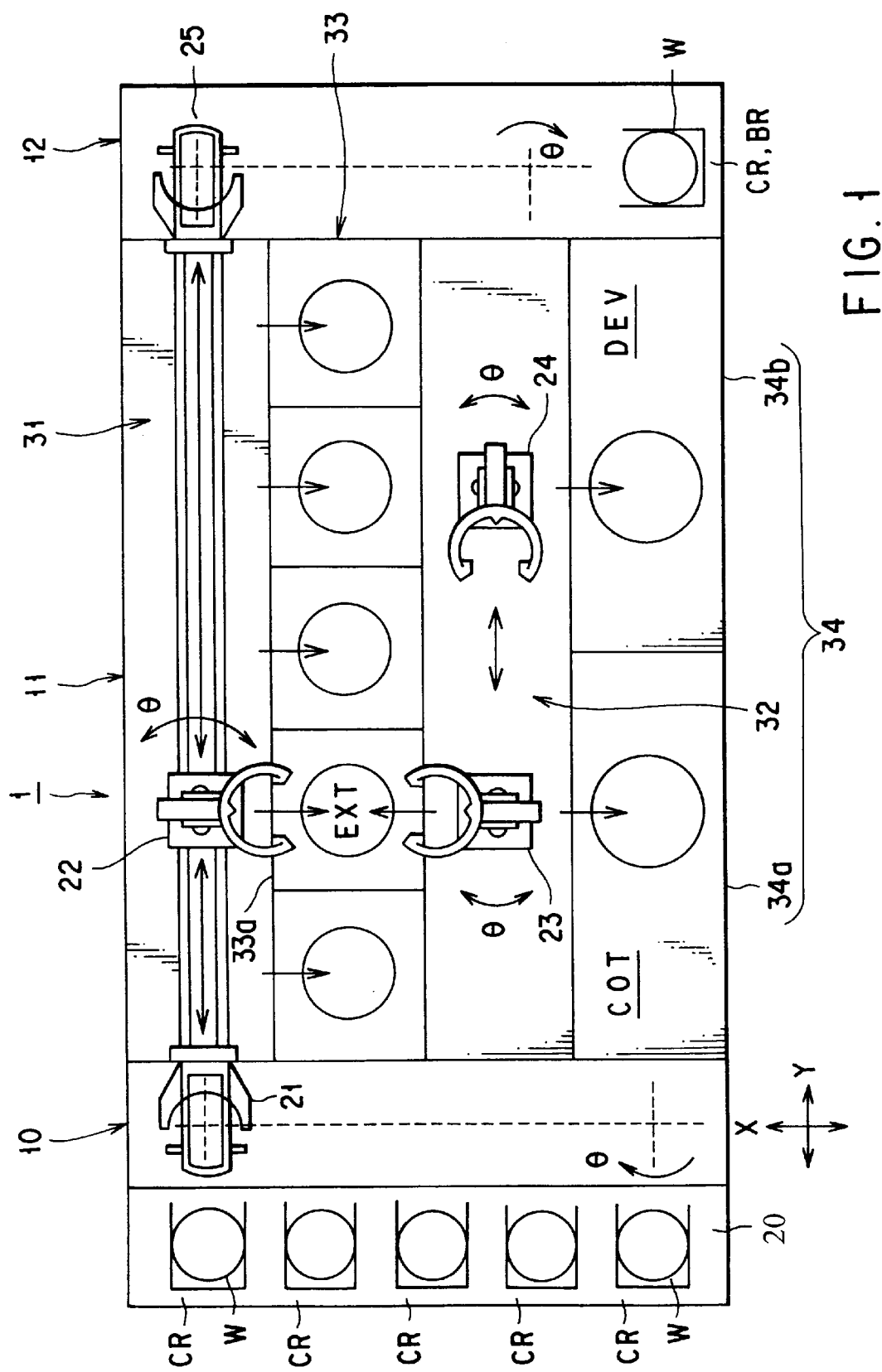
FIG. 1 is a plan view of a resist-processing apparatus according to a first embodiment of the present invention.

FIG. 1 shows a coating/developing system 1, which is the first embodiment of the invention. As FIG. 1 shows, the system 1 comprises a cassette station 10, a process station 11 and an interface section 12, which constitute an integral system. The cassette station 10 receives wafer cassettes CR from an external apparatus and sends the cassettes CR back to the external apparatus. Each cassette CR contains a plurality of wafers W. The wafers W are drawn from and inserted into the cassette CR on the cassette station 10. The process station 11 has processing units of various types and three arm mechanism 22, 23 and 24. Each processing unit is designed to process one wafer W at a time. The interface section 12 transfers wafers W to an external exposure apparatus and receives wafers W therefrom.

As shown in FIG. 1, the cassette station 10 has a cassette table 20 and a sub-arm mechanism 21. On the cassette table 20, a plurality of wafer cassettes CR, for example, five cassettes at most, are arranged in a row extending in X direction. Each cassette CR is positioned with its wafer inlet/outlet port opposing the process station 11. The sub-arm mechanism 21 can move in X direction and Z direction (i.e., the vertical direction in which wafers W are located one above another in the cassette CR). The sub-arm mechanism 21 can therefore draw any wafer W from any cassette CR mounted on the cassette table 20. Further, the sub-arm mechanism 21 can rotate in the direction of arrow θ, to transfer and receive a wafer W to and from the first arm mechanism 22 of the process station 11.

The process station 11 comprises two transport units 31 and 32, in addition to the various processing units and the arm mechanisms 22, 23 and 24. The transport units 31 and 32 operate independently.

The processing units are classified into two types, i.e., spinner type and open type. The processing units of the spinner type are a resist-coating unit COT and a developing unit DEV. The processing units of the open type are units 33 including heat treatment units. The spinner-type processing units are arranged in a row, on one side of the second transport unit 32. The open-type processing units 33 are arranged on the other side of the second transport unit 32. The open-type processing units 33 are located between the first transport unit 31 and the second transport unit 32.

The arrangement of the processing units will be described in more detail, with reference to FIGS. 1, 2 and 3.

Figure 2:
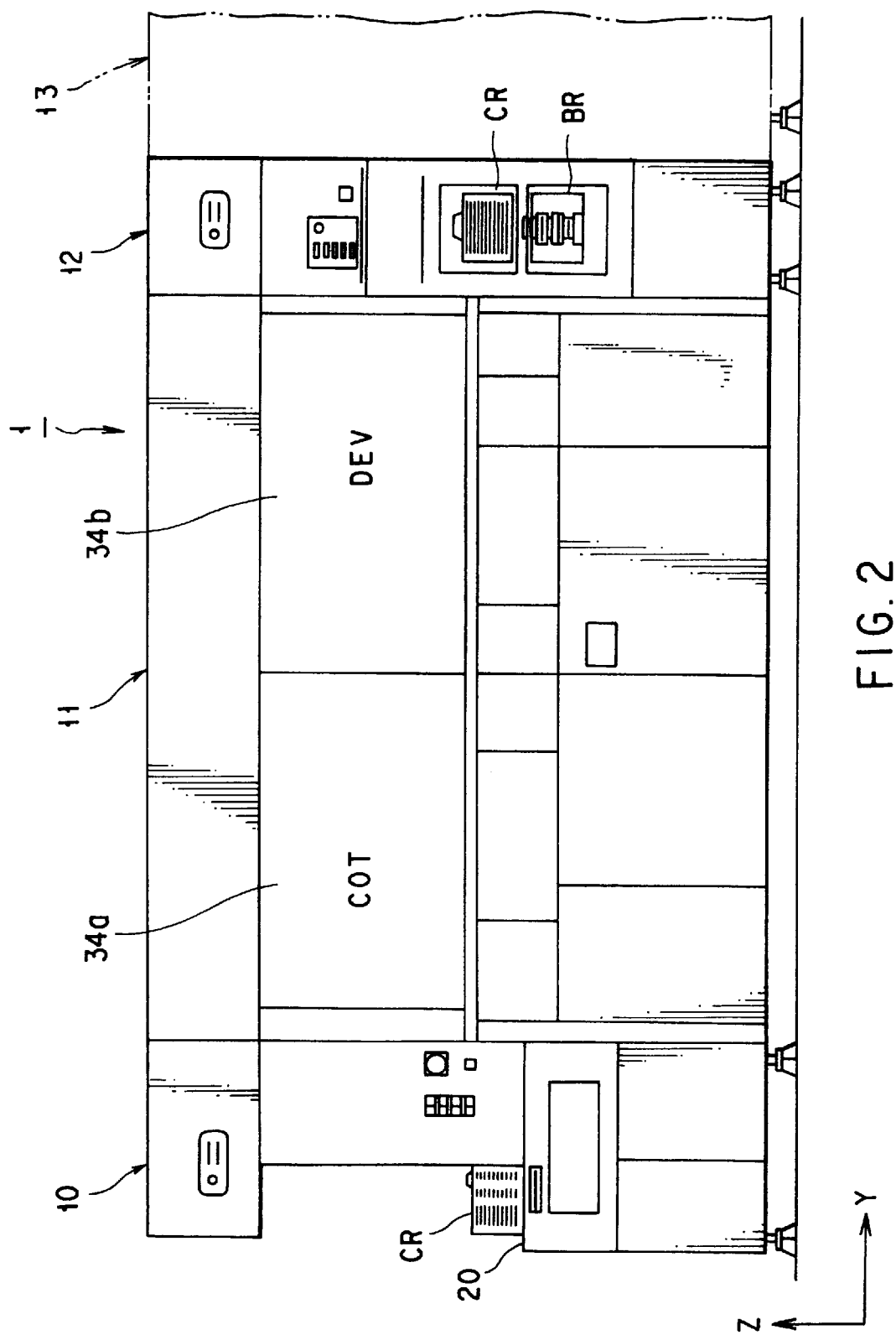
FIG. 2 is a schematic front view of the resist-processing apparatus.

As seen from FIGS. 1 and 2, the resist-coating unit COT and the developing unit DEV, either being a spinner-type unit, are arranged side by side, in a row, facing the second transport unit 32. As shown in FIGS. 1 and 3, the open-type processing units 33 (including heat treatment units) are arranged in five vertical columns, each consisting of four units. FIG. 3 is a partially sectional, side view showing the coating/developing system 1, as viewed from the first transport unit 31, and illustrating the arrangement of the open-type processing units 33.

Figure 3:
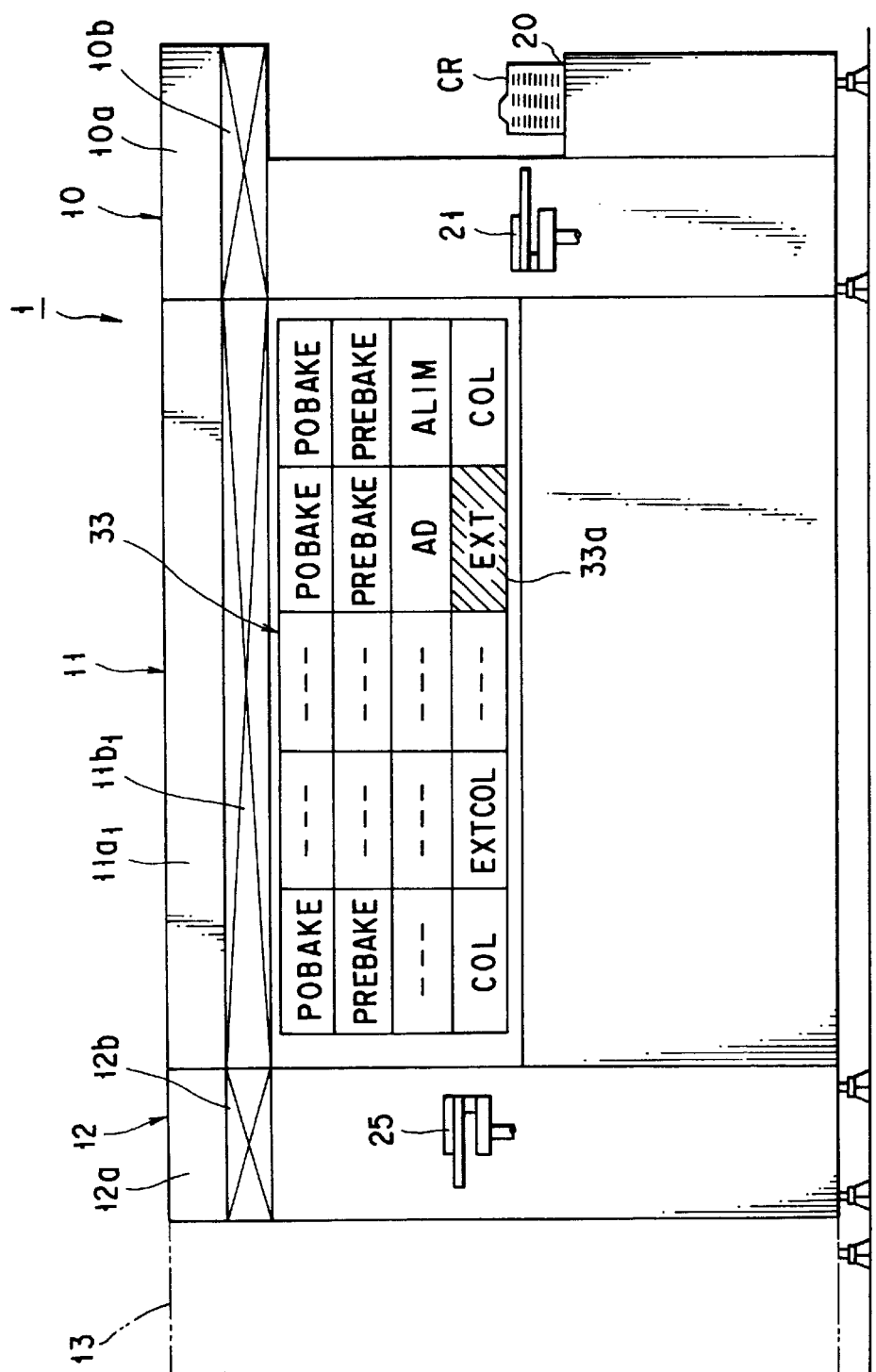
FIG. 3 is a schematic rear view of the resist-processing apparatus.

As can be understood from FIG. 3, the open-type processing units 33 include cleaning units COL, an alignment unit ALIM, an adhesion unit AD, pre-baking units PREBAKE, post-baking units POBAKE, an extension cleaning unit EXTCOL, and an extension unit EXT. The cleaning units COL clean and cool wafers W. The alignment unit ALIM aligns wafers W, placing them at desired positions. The adhesion unit AD renders each wafer W hydrophobic so that resist coated on the wafer W may be fixed well. The pre-baking units PREBAKE heat to wafers W before the wafers W are exposed to light. The post-baking units POBAKE heat the wafers W after the wafers W have been exposed to light. The extension unit EXT transfers wafers W between the first transport unit 31 and the second transport unit 32.

The cleaning units COL, extension cleaning unit EXT-COL and extension unit EXT, which process wafers W at relatively low temperatures, are located at the lowest stage. The pre-baking units PREBAKE, post-baking units POBAKE and adhesion unit AD, which process wafers W at relatively high temperatures, are located at the higher stages. Thermal interference among the units is thereby reduced.

Figure 4:
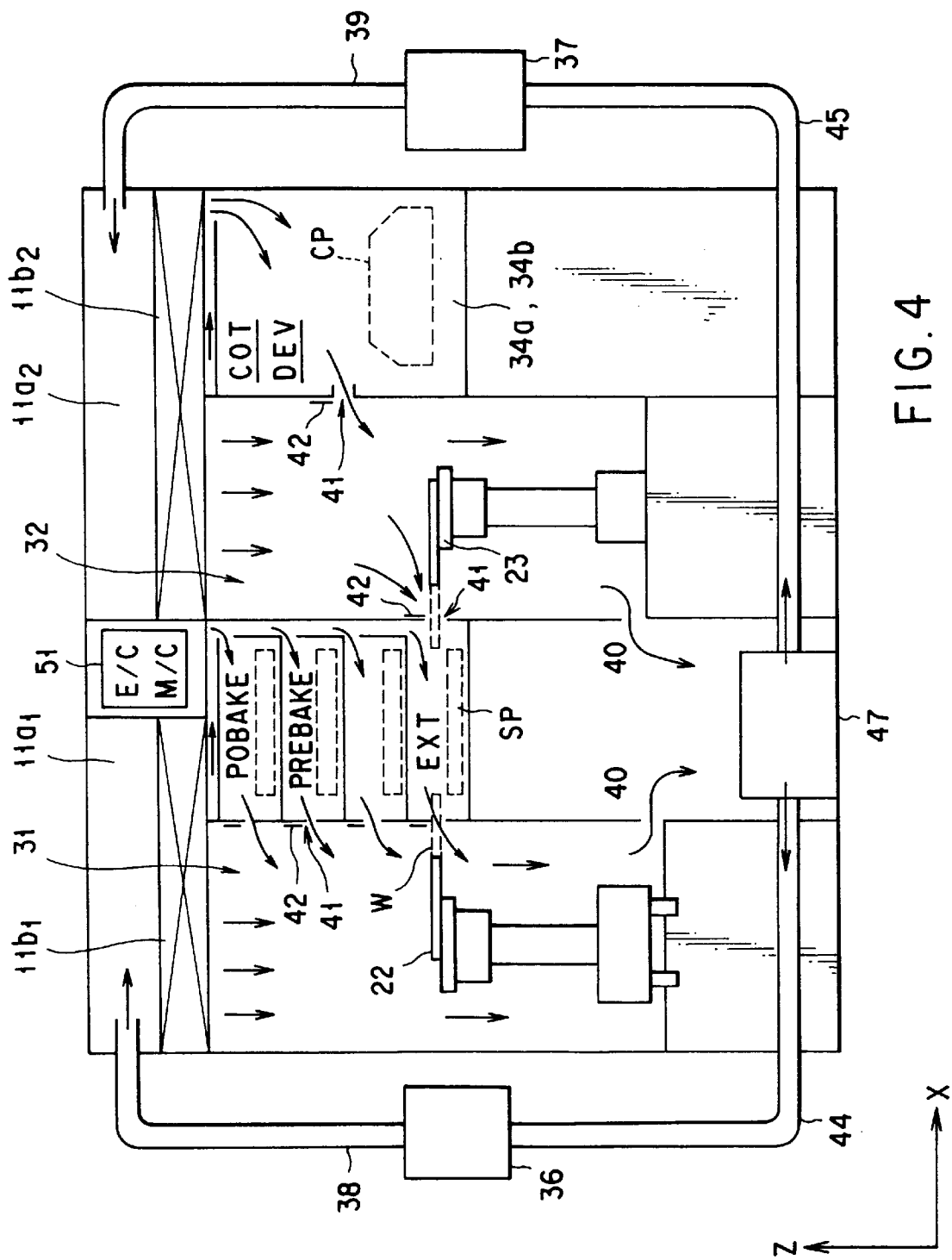
FIG. 4 is a side view illustrating the internal structure of the resist-processing apparatus and explaining how air flows in the resist-processing apparatus.

The second and third arm mechanisms 23 and 24 are provided in the second transport unit 32. Both arm mechanisms 23 and 24 can move in the Z direction and rotate in the direction of arrow θ. The second arm mechanism 23 moves wafers W into and from the extension unit EXT and resist-coating unit COT and transfers and receives wafers W to and from the third arm mechanism 24, as is illustrated in FIGS. 1 and 4. The third arm mechanism 24 transfers and receives wafers W to and from the second arm mechanism 23 and moves wafers W into and from the developing unit DEV.

As shown in FIG. 4, each processing unit has two wafer ports 41 at the opposing sides, respectively. Wafers W can therefore be inserted into and removed into each processing unit through either wafer port 41. Each wafer ports 41 can be closed and opened by driving a shutter 42 by drive means (not shown). The extension unit EXT, for example, has two wafer ports 41 made in the opposing sides and two shutters 42 for closing and opening the ports 41.

The interface section 12 incorporates a movable pickup cassette CR, a peripheral-portion exposure apparatus (not shown), a fixed buffer cassette BR, a sub-arm mechanism 25, and the like. The sub-arm mechanism 25 can move in the X direction and Z direction to transfer and receive wafers W to and from the cassettes CR and BR. The sub-arm mechanism 25 can also rotate in the direction of arrow θ, to transfer wafers W between the first arm mechanism 22 of the process station 11 and the wafer table (not shown) of an exposure apparatus (not shown) provided outside the system 1.

Figure 5:
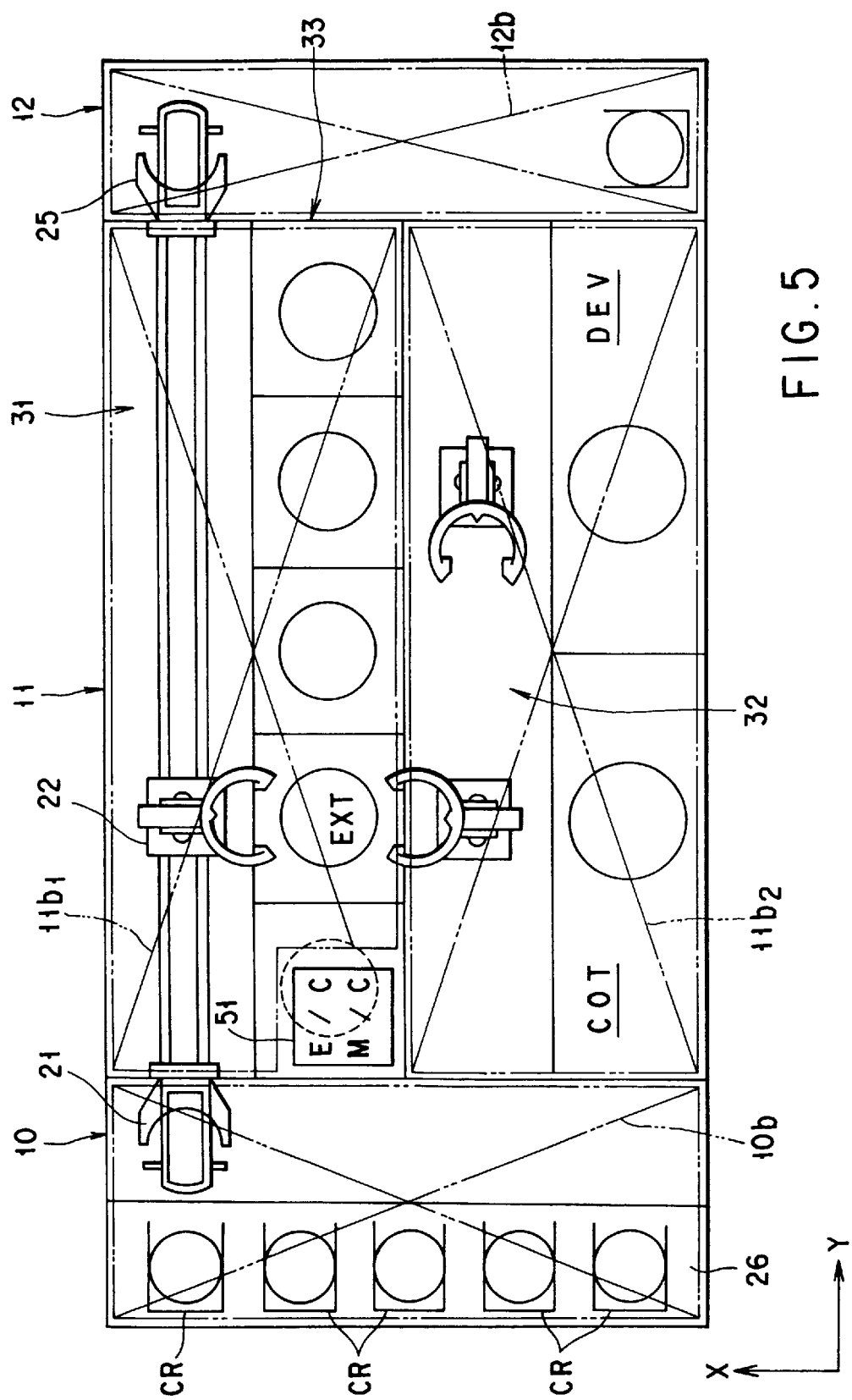
FIG. 5 is a plan view of the resist-processing apparatus, showing the position of the upper filter incorporated in the apparatus.

As shown in FIGS. 3, 4 and 5, air supply chambers 10a, 11a1, 11a2 and 12a are provided above the cassette station 10, process station 11 and interface section 12. Four dust filters 10b, 11b1, 11b2 and 12b are attached to the bottoms of the chambers 10a, 11a1, 11a2 and 12a, respectively. An air conditioner 37 is provided outside the coating/developing system 1 and connected thereto by a pipe 39. Air is supplied from the air conditioner 37 through the pipe 39 into the air supply chambers 10a, 11a1, 11a2 and 12a. Clean air is supplied in down-flow fashion, from the chamber 10a into the cassette section 10, from the chambers 11a1 and 11a2 into the process section 11, and from the chamber 12a into the interface section 12. The air flowing downwards passes through holes 40 provided in a lower part of the system 1. Finally, the air flows from the system 1 through an exhaust port 47 made in the bottom of the system 1 and back into the air conditioner 37 through a pipe 45.

In the coating/developing system 1, the air conditioner 37 supplies air into the air supply chamber 11a2 located above the second transport unit 32, resist-coating unit COT and developing unit DEV, at a higher flow rate than into the air supply chamber 11a1 located above the first transport unit 31 and open-type processing units 33 (including heat treatment units). The pressure in the chamber 11a2 is therefore higher than the pressure in the chamber 11a1. Hence, air flows always from the second transport unit 32 to the first transport unit 31 in the extension unit EXT in which wafers W are transferred between the transport units 31 and 32. This prevents contaminators, such as particles, from entering the processing units using liquid, through the extension unit EXT.

In any process of applying a liquid to wafers particularly the process of developing wafers W, it is important to prevent chemicals contained in the atmosphere, such as alkaline substances (e.g., ammonia gas, amine gas and the like), from adsorbing to the surfaces of wafers W. In view of this, the filter 11b2 for cleaning air before introducing it into the second transport unit 32 and the liquid-using processing units (i.e., COT and DEV) is a filter which can efficiently adsorb, removing chemicals from air, such as a chemical HEPA filter (ULPA filter). By contrast, the other filters 10b, 11b1 and 12b are small and inexpensive filters, such as HEPA filters. The use of HEPA filters helps to reduce the size and manufacturing cost of the system 1.

Of course, the filters 10b, 11b1 and 12b can be chemical HEPA filters. Were they chemical HEPA filters, however, it would be difficult to make the system 1 small and lower the manufacturing cost thereof.

Since the liquid-using system and the heat treatment system are isolated from each other, it is possible to use filters of one type in the liquid-using system and filters of another type in the heat treatment system. Thus, large and expensive filters need not be used in the heat treatment system, too. The coating/developing system 1 can therefore be made small at lower cost than otherwise. The filters used in the liquid-using system are not limited to chemical HEPA filters. The filters used in the heat treatment system are not limited to HEPA filters, either.

Figure 6:
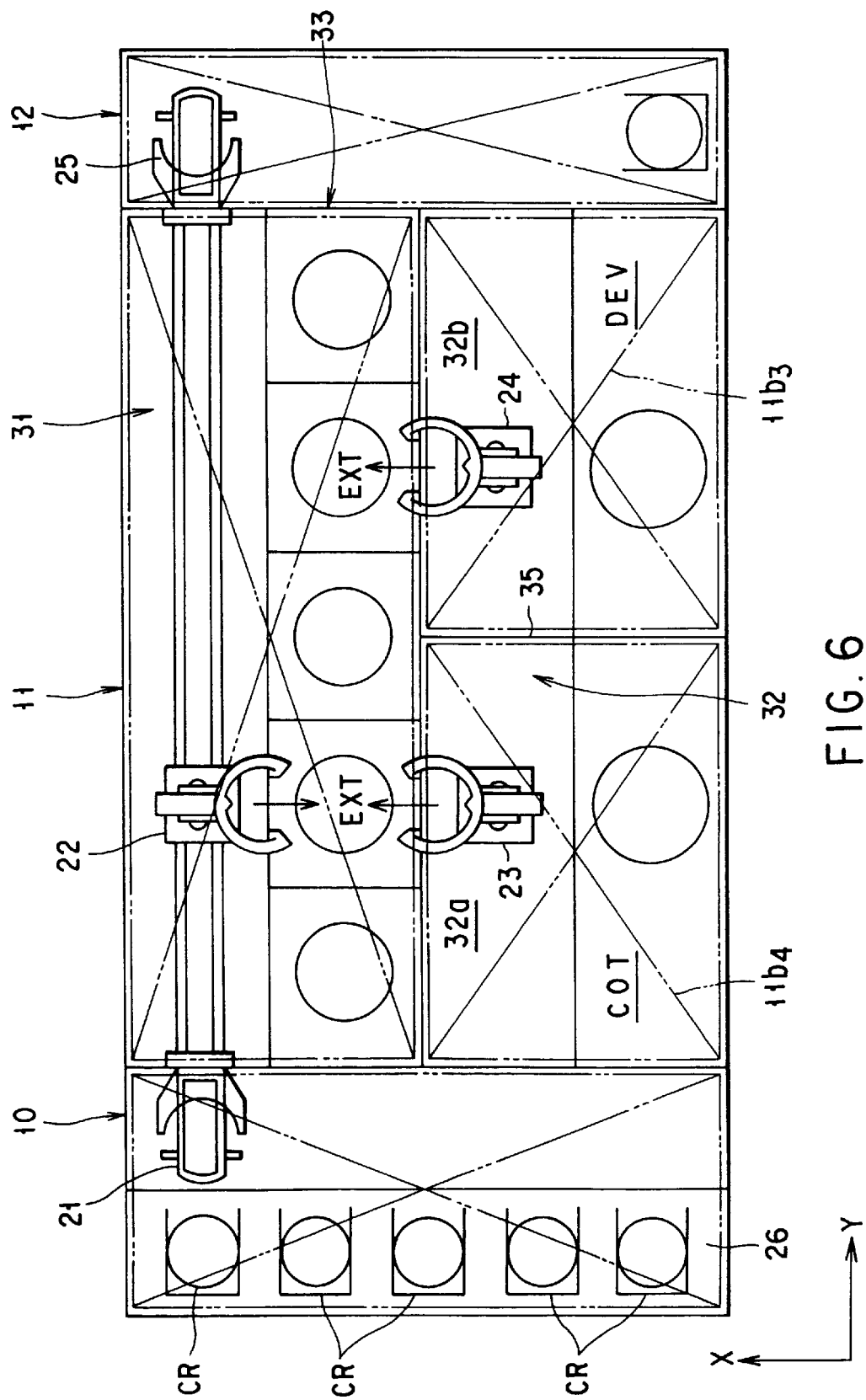
FIG. 6 is a plan view of a resist-processing apparatus according to a second embodiment of the present invention.

FIG. 6 a coating/developing system according to the second embodiment of the present invention. As shown in FIG. 6, a partition 35 divides the space in the second transport unit 32 into to rooms 32a and 32b. The second arm mechanism 23 is provided in the first room 32a, and the third arm mechanism 34 is provided in the second room 32b. The lowest two of the open-type processing units 33 (i.e., heat treatment system) located between the first and second transport units 31 and 32 are used as extension units EXT for transferring and receiving wafers W to the arm mechanisms 23 and 24.

In the second embodiment having these structural features, only the filter 11b3 located above the developing unit DEV provided in the second room 32b of the second transport unit 32 is a filter that can efficiently adsorb and remove chemicals from air.

The coating/developing system 1 according to the first embodiment has a circuit box 51, as is shown in FIGS. 4 and 5. The circuit box 51 is located above the open-type processing units 33, not above the liquid-using processing units (resist-coating unit COT and developing unit DEV). The box 51 contains a printed circuit board. Mounted on the circuit board are a main controller E/C, various controllers M/C, a power-supply circuit, and the like. The main controller E/C controls the controllers M/C, which in turn controls the arm mechanisms 22, 23 and 24, the various processing units, a touch panel (not shown), and the like.

The circuit box 51 is a component which generates heat while operating. The box 51 must be positioned so that the heat it generates may influence any other component as little as possible. Hence, the circuit box 51 is located as far as possible from the regions where liquids, such as the resist and the developer, are stored, and above the liquid-using processing units, such as the resist-coating unit Cot and the developing unit DEV. Further, the circuit box 51 is placed far above the liquid-using processing units, but not right above any one of these units.

In the liquid-using processing units, resist is formed on wafers W while strict temperature control is being performed on the wafers W. Hence, a change in the temperature of a wafer W may result in changes in the thickness of the resist formed on the wafer W by using the resist as a mask, even if the temperature change is small. This is why the circuit box 51, which generates heat while operating, is located far above the resist-coating unit COT and the developing unit DEV, but not right above the unit COT or the unit DEV. Since the box 51 is so located, the influence the heat generated by the box 51 imposes on the forming and development of the resist is minimized to enhancing the yield of the manufacture of semiconductor devices.

As described above, the circuit box 51 is located above the open-type processing units 33, not right above the liquid-using processing units (i.e., resist-coating unit COT and developing unit DEV), and the heat the box 51 generates hardly influences the forming or development of the resist. Since the box 51 is located far above the open-type processing units 33, no thermal interference takes place between the circuit box 51 and the open-type processing units 33.

Needless to say, the circuit box 51 may be provided above the first transport unit 31 or the second transport unit 32, though it is preferable that the box 51 be provided above the open-type processing units 33.

The sequence of the processes carried out in the coating/developing system 1 will be explained below.

First, the sub-arm mechanism 21 of the cassette station 10 has an access to one of the cassettes CR placed on the cassette table 20. The sub-arm mechanism 21 draws a wafer W from the cassette CR, which has yet to be processed. The sub-arm mechanism 21 transfers the wafer W to the first arm mechanism 22 provided at the first transport unit 31 of the process station 11. The first arm mechanism 22 moves in the Y direction and Z direction (vertical direction), transferring the wafer W to the alignment unit ALIM. The first arm mechanism 22 rotates in the direction of arrow θ, transferring the wafer W into the alignment unit ALIM.

In the alignment unit ALIM, the wafer W is centered and oriented. The first arm mechanism 22 receives the wafer W from the alignment unit ALIM. The first arm mechanism 22 moves in the Y direction and Z direction (vertical direction), transferring the wafer W into the adhesion unit AD. In the adhesion unit AD, the wafer W is rendered hydrophobic.

The first arm mechanism 22 transfers the wafer W into a prescribed one of the pre-baking units PREBAKE. In the unit PREBAKE the wafer W is pre-baked. The arm mechanism 22 transfers the wafer W from the pre-baking unit PREBAKE into a prescribed one of the cooling units COL. In the cooling unit the wafer W is cooled to a predetermined temperature of, for example, 23° C., at which the wafer W should be maintained before subjected to resist-coating.

When the wafer W is cooled to the predetermined temperature, the first arm mechanism 22 draws the wafer W from the cooling unit COL. The mechanism 22 moves to the extension unit EXT and inserting the wafer W into the extension unit EXT. In the extension unit EXT, the wafer W is placed on the table SP.

Thereafter, the wafer W is transported from the extension unit EXT into the second transport unit 32. More precisely, the shutter 42 is opened, opening that wafer port 41 of the unit EXT which opposes the second transport unit 32. The second arm mechanism 23 provided in the second transfer unit 32 draws the wafer W from the unit EXT through the wafer port 41. Then, the shutter 42 is closed.

As mentioned above, two shutters 42 are provided for closing and opening the two wafer ports 41 made in the opposing sides of the extension unit EXT. These shutters 42 can be dispensed with, if the pressure in the second transfer unit 32 is maintained higher than the pressure in the first transfer unit 31, thereby preventing foreign matters (e.g., particles) from entering the second transport unit 32 from the first transport unit 32.

Thereafter, the second arm mechanism 23 transfers the wafer W to the resist-coating unit COT. In the resist-coating unit COT, a resist is coated on the surface of the wafer W.

The second arm mechanism 23 draws the wafer W, now coated with the resist, from the resist-coating unit COT and inserts the wafer W into the extension unit EXT again. The first arm mechanism 22 draws the wafer W from the extension unit EXT. The first arm mechanism 22 moves in the Y direction and Z direction, transferring the wafer W to a prescribed one of the pre-baking units PREBAKE. Then, the first arm mechanism 22 inserts the wafer W into the prescribed pre-baking unit PREBAKE. In the pre-baking unit PREBAKE, the wafer W is heated for a prescribed time at a predetermined temperature of, for example, 100° C. Residual solvent is thereby evaporated from the resist coated on the wafer W.

The first arm mechanism 22 draws the wafer W from the pre-baking unit PREBAKE and inserts the same into the extension cleaning unit EXTCOL. In the extension cooling unit EXTCOL, the wafer W is cooled to a predetermined temperature of, for example, 24° C., at which the wafer W should be exposed to light in the peripheral-portion exposure apparatus provided in the interface section 12.

Next, the first arm mechanism 22 provided in the first transport unit 31 draws the wafer W from the extension cooling unit EXTCOL and transfers the wafer W to the sub-arm mechanism 25 provided in the interface section 12. The sub-arm mechanism 25 inserts the wafer W into the peripheral-portion exposure apparatus (not shown) provided outside the interface section 12. In the peripheral-portion exposure apparatus, the wafer W has its peripheral portion exposed to light.

The sub-arm mechanism 25 draws the wafer W from the peripheral-portion exposure apparatus and transfers the same onto the wafer table provided in the external exposure device (not shown). If necessary, the wafer W may be temporarily stored in the buffer cassette BR before it is transferred to the external exposure apparatus.

In the external exposure apparatus, the wafer W is exposed to light and then moved back onto the wafer table. Then, the sub-arm mechanism 25 provided in the interface section 12 transfers the wafer W from the wafer table to the first transport unit 31.

The first arm mechanism 22 provided in the unit 31 inserts the wafer W into a prescribed one of the post-baking units POBAKE. In the post-baking unit the wafer W is baked for a predetermined time. The wafer W thus post-baked is inserted one of the cooling units COL by the first arm mechanism 22. In the cooling unit the wafer W is cooled to normal temperature.

The wafer W is then inserted into the extension unit EXT. The second arm mechanism 23 provided in the second transport unit 32 draws the wafer W from the extension unit EXT and transfers the same to the third arm mechanism 24 provided in the second transport unit 32. The third arm mechanism 24 inserts the wafer W into the developing unit DEV.

In the developing unit DEV, the wafer W is placed on a spinning chuck. A developing solution is applied uniformly onto the wafer W by, for example, spray method, thereby developing the resist formed on the surface of the wafer W. A rinsing solution is applied to the wafer W in the developing unit DEV, removing the developing solution of the wafer W.

Thereafter, the third arm mechanism 24 provided in the second transport unit 32 draws the wafer W from the developing unit DEV and transfers the same to the second arm mechanism 23. The second arm mechanism 23 inserts the wafer W into the extension unit EXT. The first arm mechanism 22 provided in the first transport unit 31 moves the wafer out of the extension unit EXT and inserts the same into a predetermined one of the post-backing units POBAKE. In the post-baking unit POBAKE, the wafer W is heated for a prescribed time at, for example, 100° C. The resist, which has swollen during the developing process, is thereby hardened, becoming resistant to chemicals.

Upon completion of the post baking, the first arm mechanism 22 provided in the first transport unit 31 takes the wafer W from the post-baking unit POBAKE and inserts the wafer W into a predetermined one of the cooling units COL. In the cooling unit COO, the wafer W is then cooled to normal temperature. The first arm mechanism 22 transfers the wafer W thus cooled to the sub-arm mechanism 21 provided at the cassette station 10. The sub-arm mechanism 21 inserts the wafer W into one of the cassette-holding grooves provided in a cassette CR that is placed on the cassette table 20.

Foreign matter, such as dust, may enter the process station 11 from the external exposure apparatus through the interface section 12. Even if foreign matter so enters the process station 11, it will not go beyond the first transport unit 31. It is next to impossible for the foreign matter to move to the second transport unit 32 which inserts and draws the wafer W from and into the resist-coating unit COT and the developing unit DEV. Foreign matter will not stick or will scarcely stick to the wafer W before or while a resist is coated or developed on the wafer W. This minimize a decrease in the yield of the manufacture of semiconductor devices.

The second transport unit 32 is dust-tight enough to prevent foreign matter, such as dust, from entering it or to minimize the possibility that the foreign matter enter it. Hence, foreign matter will not stick or will scarcely stick to the wafer W before or while a resist is coated or developed on the wafer W, minimizing a decrease in the yield of the manufacture of semiconductor devices.

As shown in FIG. 6, the space in the second transport unit 32 may be divided by a partition 35 into to two rooms 32a and 32b. The second and third arm mechanisms 23 and 24 may be provided in the first and second rooms 32a and 32b, respectively. The lowest two of the open-type processing units 33 (i.e., heat treatment system) located between the first and second transport units 31 and 32 may be used as extension units EXT for transferring and receiving wafers W to the arm mechanisms 23 and 24.

In the first and second embodiments described above, the extension units EXT are selected from the lowest ones of the open-type processing units 33 (i.e., heat treatment system). Instead, some of the processing units 33 located at the second stage or the third stage (i.e., highest stage) may be used as extension units EXT.

Figure 7:
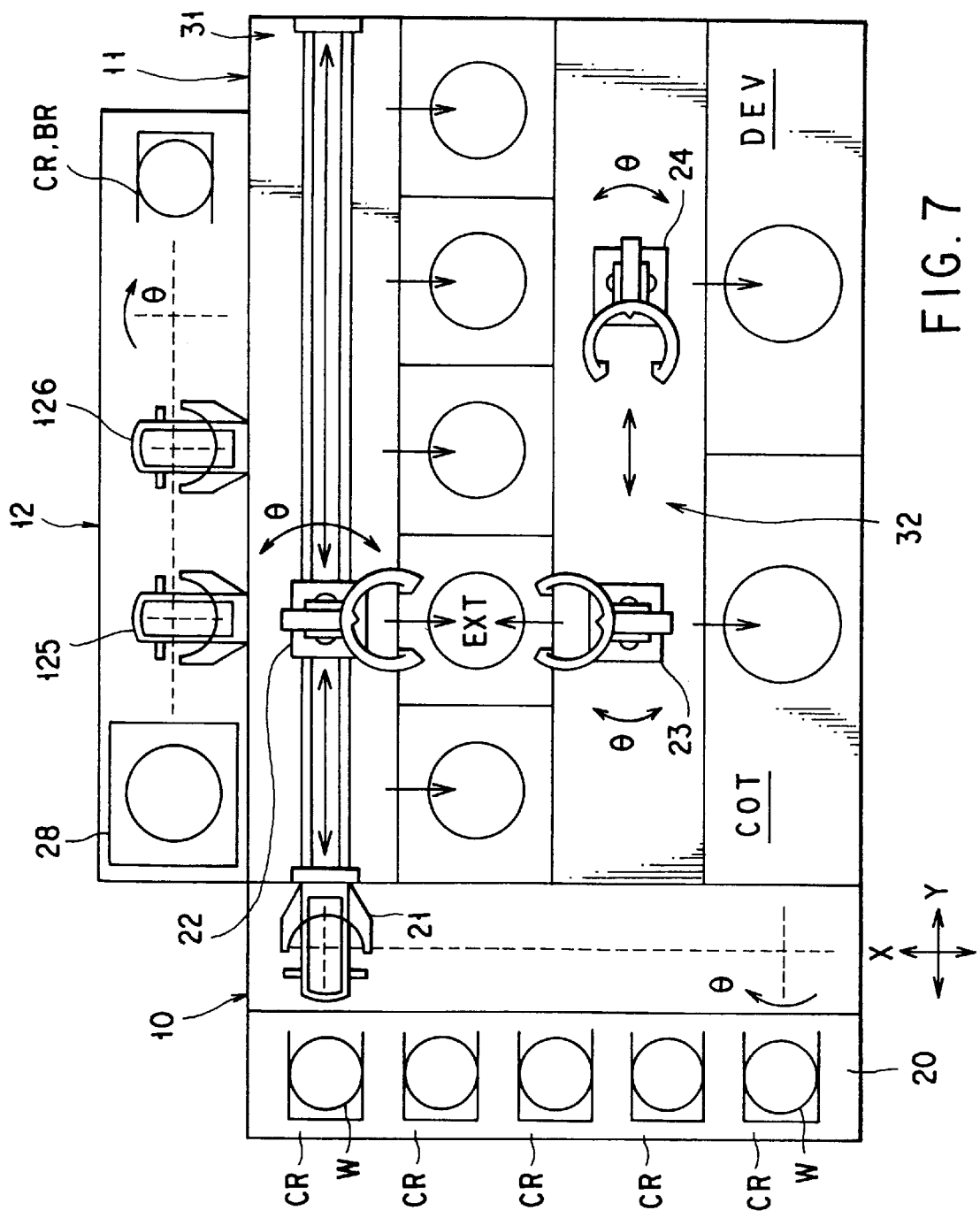
FIG. 7 is a plan view of a resist-processing apparatus according to a third embodiment of the invention.

FIG. 7 is a plan view of a resist-processing apparatus according to a third embodiment of the invention. As shown in FIG. 7, the interface section 12 is provided at the outer side of the first transport unit 31 and opposes the open-type processing units 33 (including heat treatment units). Namely, the third embodiment differs in the position of the interface section 12 from the first and second embodiment, in which the process station 11 is located between the cassette station 10 and the interface section 12. In the third embodiment, a plurality of arm mechanisms, or two arm mechanisms 125 and 126 are provided in the interface section 12. The arm mechanisms 125 and 126 can temporarily hold wafers W in the course of transferring the wafers W between the external exposure apparatus and the process station 11. As shown in FIG. 7, the interface section 12 incorporates a peripheral-portion exposure apparatus 28 designed to apply light to the peripheral portion of a wafer W.

Figure 8:
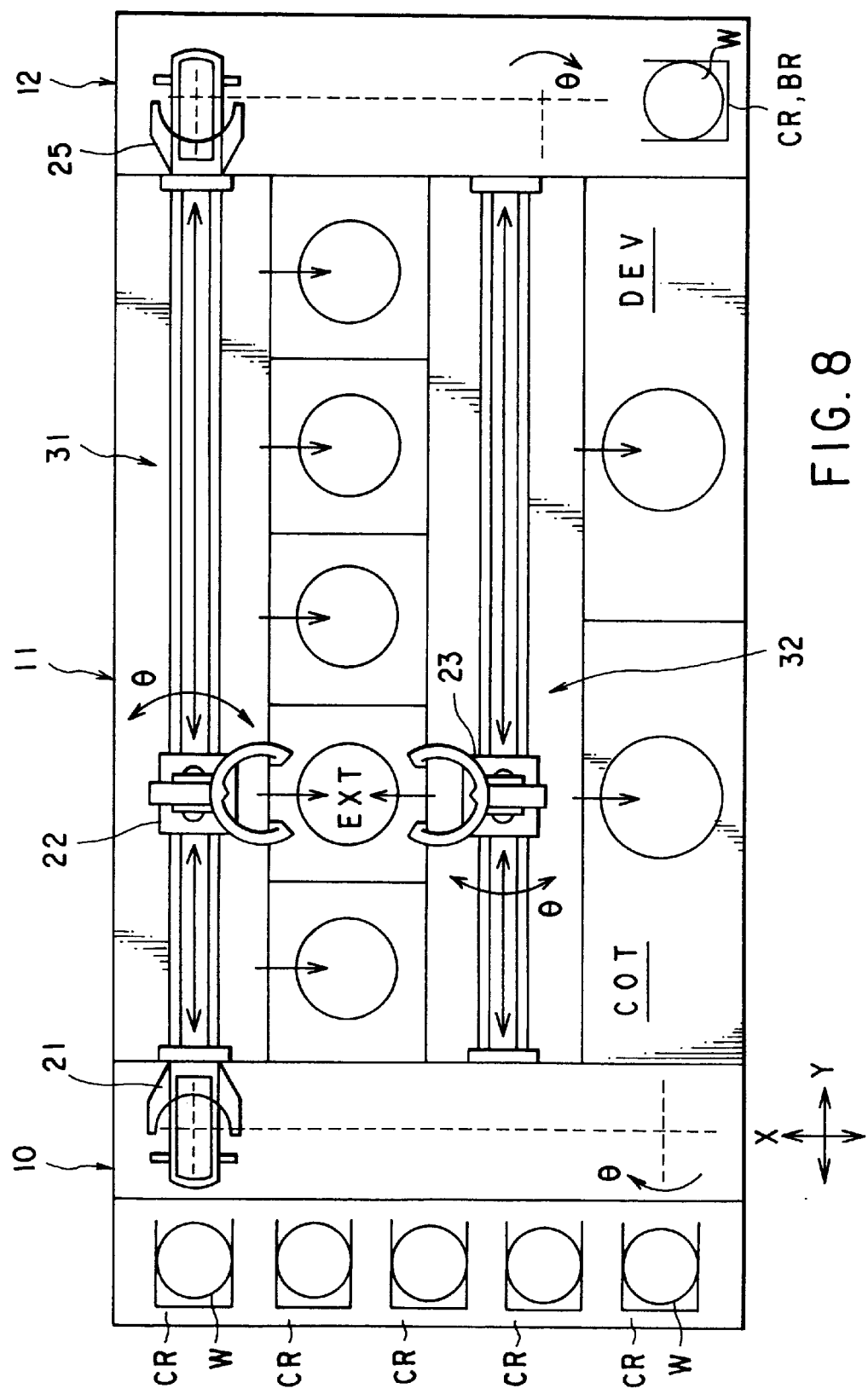
FIG. 8 is a plan view of a resist-processing apparatus according to a fourth embodiment of this invention.

FIG. 8 is a plan view of a resist-processing apparatus according to a fourth embodiment of this invention. The fourth embodiment is characterized in that the second arm mechanism 223 differs from the arm mechanism 23 used in the first to third embodiments. The second arm mechanism 223 is substantially identical in structure to the first arm mechanism 22 provided in the first transport unit 31, and can move in Y direction.

The resist-processing apparatus according to any embodiment, described above, is designed to process semiconductor wafers. Nonetheless, the present invention can be applied to a resist-processing apparatus that is designed to process objects of any other type, such as glass substrates for use in LCDs.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resist-processing apparatus comprising:
a cassette section with reference to which a plurality of substrates are inserted or taken out, along with cassettes;
an interface section arranged at a position away from the cassette section, said interface section being connected or connectable to an external apparatus used for processing a substrate;
a plurality of first processing units, arranged between the cassette section and the interface section, and configured to process a substrate;
a second processing unit, arranged between the cassette section and the interface section, and configured to process the substrate;
a first transport unit extending from the cassette section to the interface section along said first processing units;
a first arm mechanism provided for the first transport unit, and configured to load or unload a substrate with reference to each of the first processing units, to transport the substrate between the cassette section and each of the first processing units, and further to transport the substrate between the cassette section and the interface section;
a second transport unit extending from the cassette section to the interface section and arranged along both the first and second processing units, said second transport unit opposing the first transport unit, with the first processing units being located between the first transport unit and the second transport unit; and
a second arm mechanism provided for the second transport unit and configured to load and unload the substrate with reference to at least one of the first processing units and the second processing unit.

2. An apparatus according to claim, 1 wherein said second processing unit includes a resist-coating mechanism configured to coat said substrate with a resist, and said first arm mechanism transfers the substrate from the resist-coating mechanism to the external apparatus by way of the interface section after the substrate is coated with the resist.

3. An apparatus according to claim 1 wherein:
said first processing units each include a heat treatment mechanism which causes substantial thermal effects to a substrate; and
said second processing unit includes a liquid treatment mechanism which causes no substantial thermal effects to a substrate.

4. An apparatus according to claim 1, wherein:
said first processing units each include a heat treatment mechanism which heats or cools a substrate; and
said second processing unit includes a resist-coating mechanism configured to coat a resist solution on the substrate, and a developing mechanism configured to develop a coated resist film that is subjected to pattern exposure by the external apparatus.

5. An apparatus according to claim 1, wherein said second processing unit opposes said first processing units, with said second transport unit being located between said first processing units, and said second transport unit arranged in parallel to each other.

6. An apparatus according to claim 1, further comprising:
a first filter section communicating with an upper portion of the first transport unit;
a second filter section communicating with an upper portion of the second transport unit;
a first air conditioner communicating with the first filter section;
a second air conditioner communicating with the second filter section;
an exhaust port communicating with both the first and second air conditioners and further with lower portions of the first and second transport units; and
a controller configured to adjust the first and second air conditions, so as to control an inner pressure of the second transport unit to be higher than an inner pressure of the first transport unit.

7. An apparatus according to claim 1, further comprising:
a first filter section having a first filter element which is configured to introduce clean air into the first processing units and the first transport unit; and
a second filter section having a second filter element which is different from the first filter element and which is configured to introduce clean air into the second processing unit and the second transport unit, said second filter element having a chemical function which removes alkaline substances from air.

8. An apparatus encoring to claim 1, further comprising an extension unit, provided in each of the first processing units and located between the first and second transport units, configured to temporarily hold the substrate when the substrate is transferred between the first arm mechanism and the second arm mechanism.

9. An apparatus according to claim 1, further comprising an electronic control unit provided above a region located above at least one of the cassette section and the first transport units, said region being a region other than that located above said second processing unit.

10. A resist-processing apparatus comprising:
a cassette section with reference to which a plurality of substrates are inserted or taken out, along with cassettes;
a plurality of first processing units, arranged adjacent to the cassette section, and configured to process a substrate;
a second processing unit, arranged adjacent to the cassette section, and configured to process the substrate;
a first transport unit arranged along the first processing units;
a first arm mechanism, provided for the first transport unit, and configured to load or unload a substrate with reference to each of the first processing units, and to transport the substrate between the cassette section and each of the first processing units;
a second transport unit arranged along both the first and second processing units, said second transport unit opposing the first transport unit, with the first processing units being located between the first transport unit and the second transport unit;

a second arm mechanism, provided for the second transport unit, and configured to load and unload the substrate with reference to at least one of the first processing units and the second processing unit;

a first filter section communicating with an upper portion of the first transport unit;

a second filter section communicating with an upper portion of the second transport unit;

a first air conditioner communicating with the first filter section;

a second air conditioner communicating with the second filter section;

an exhaust port communicating with both the first and second air conditions and further with lower portions of the first and second transport units; and a controller configured to adjust the first and second air conditioners, so as to control an inner pressure of the second transport unit to be higher than an inner pressure of the first transport unit.

11. An apparatus according to claim 10, further comprising:

a first filter section having a first filter element which is configured to introduce clean air into the first processing units and the first transport unit; and a second filter section having a second filter element which is different from the first filter element and which is configured to introduce clean air into the second processing unit and the second transport unit, said second filter element having a chemical function which removes alkaline substances from air.

12. An apparatus according to claim 11, wherein:

said first filter section allows the clean air to be supplied into part of the first processing units and the first transport unit; and said second filter section allows the clean air to be supplied into part of the second processing unit and the second transport unit.

13. An apparatus according to claim 10, wherein:

said first processing units each include a heat treatment mechanism which causes substantial thermal effects to a substrate; and said second processing unit includes a liquid treatment mechanism which causes no substantial thermal effects to a substrate.

14. An apparatus according to claim 10, wherein said second processing unit opposes said first processing units, with said second transport only being located between said first processing units and said second transport unit.

15. An apparatus according to claim 10, further comprising an extension unit, provided in each of the first processing units and located between the first and second transport units, configured to temporarily hold the substrate when the substrate is transferred between the first arm mechanism and the second arm mechanism.

16. An apparatus according to claim 10, further comprising an interface arranged at a position away from the cassette section, said interface section being connected or connectable to an external apparatus used for processing a substrate.

17. An apparatus according to claim 10, farther comprising an electronic control unit provided above a region located above at least one of the cassette section and the first transport units, said region being a region other then that located above said second processing unit.

18. A resist-processing apparatus comprising:

a plurality of first processing units each being configured to process a substrate;

a second processing unit configured to process the substrate;

a first transport unit arranged along the first processing units;

a first arm mechanism, provided for the first transport unit, and configured to load or unload a substrate with reference to each of the first processing units;

an external-transfer section for receiving and supplying a substrate to and from an external apparatus;

a second transport unit isolated from the external-transfer section to prevent mutual interferences of atmosphere, said second transport unit opposing the first transport unit, with the first processing units being located between the first transport unit and the second transport unit; and a second arm mechanism, provided for the second transport unit, and configured to load and unload the substrate with reference to at least one of the first processing units and the second processing unit.

19. An apparatus according to claim 18, further comprising a third arm mechanism, provided for the external-transfer section, and configured to receive a substrate from the external apparatus and transfer the substrate to the external apparatus.

20. Art apparatus according to claim 18, wherein said external-transfer section includes at least one of a cassette station and an interface section.

21. An apparatus according to claim 18, wherein:

said first processing units each include a heat treatment mechanism which causes substantial thermal effects to a substrate; and said second processing unit includes a liquid treatment mechanism which causes no substantial thermal effects to a substrate.

22. An apparatus according to claim 18, wherein, said second processing unit opposes said first processing units, with said second transport unit is located between said first processing units and said second transport unit.

23. An apparatus according to claim 18, further comprising:

a first filter section communicating with an upper portion of the first transport unit;

a second filter section communicating with an upper portion of the second transport unit;

a first air conditioner communicating with the first filter section;

a second air conditioner communicating with the second filter section;

an exhaust port communicating with both the first and second air conditioners and further with lower portions of first and second transport units, and a controller configured to adjust the first and second air conditioners, so as to control an inner pressure of the second transport unit to be higher than an inner pressure of the first transport unit.

24. Art apparatus according to claim 18, further comprising:

a first filter section having a first filter element which is configured to introduce clean air into the first processing units and the first transport unit; and a second filter section having a second filter element which is different from the first filter element and which is configured to introduce clean air into the second processing unit and the second transport unit, said second filter element having a chemical function for removing alkaline substances from air.

25. An apparatus according to claim 18, further comprising an extension unit, provided in each of the first processing units and located between the first and second transport units, configured to temporarily hold the substrate when the substrate is transferred between the first arm mechanism and the second arm mechanism.

26. An apparatus according to claim 18, further comprising an electronic control unit provided above a region located above at least one of the cassette section and the first transport units, said region being a region other than that located above said second processing unit.

* * * * *